United States Patent
Terrovitis et al.

(10) Patent No.: US 7,132,865 B1
(45) Date of Patent: Nov. 7, 2006

(54) MITIGATING PARASITIC CURRENT THAT LEAKS TO THE CONTROL VOLTAGE NODE OF A PHASE-LOCKED LOOP

(75) Inventors: Manolis Terrovitis, Berkeley, CA (US); Srenik Mehta, Pleasanton, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 19 days.

(21) Appl. No.: 10/898,423

(22) Filed: Jul. 23, 2004

Related U.S. Application Data

(60) Provisional application No. 60/550,000, filed on Mar. 3, 2004.

(51) Int. Cl.
*H03L 7/06* (2006.01)

(52) U.S. Cl. .......................... 327/157; 331/16
(58) Field of Classification Search .................. 331/16; 327/157

See application file for complete search history.

(56) References Cited

U.S. PATENT DOCUMENTS

| | | | |
|---|---|---|---|
| 6,069,502 A | 5/2000 | Preslar et al. | |
| 6,483,358 B1 * | 11/2002 | Ingino, Jr. | 327/157 |
| 6,829,311 B1 * | 12/2004 | Riley | 375/326 |
| 6,956,417 B1 * | 10/2005 | Bernstein et al. | 327/157 |
| 2002/0089382 A1 * | 7/2002 | Yang | 331/17 |

* cited by examiner

*Primary Examiner*—Joseph Chang
(74) *Attorney, Agent, or Firm*—Bever, Hoffman & Harms, LLP; Jeanette S. Harms

(57) ABSTRACT

Parasitic current at the control voltage node of a phase-locked loop (PLL) can significantly reduce performance of the PLL. Off-state transistors in either the charge pump or the filter can cause this parasitic current. A method of canceling a parasitic current generated by the charge pump in the PLL is described. In this method, a leakage current associated with leaky circuits in the charge pump can be determined. An opposing current can be injected to the control voltage node. This opposing current is equal, but opposite, to the leakage current. A method of eliminating a parasitic current generated by the filter in the PLL is also described. In this method, for each programmable capacitor in an unused state, a unity gain buffer can charge the capacitor to the same potential as the control voltage node, thereby providing the same potential on both sides of the switch.

14 Claims, 7 Drawing Sheets

MITIGATING PARASITIC CURRENT THAT LEAKS TO THE CONTROL VOLTAGE NODE OF A PHASE-LOCKED LOOP

RELATED APPLICATIONS

This application claims priority of U.S. Provisional Patent Application 60/550,000, entitled "System And Method For Communication" filed Mar. 3, 2004.

BACKGROUND OF THE INVENTION

1. Field of the Invention

The present invention relates to a phase-locked loop and in particular to canceling or eliminating a parasitic current that leaks to the control voltage node of this phase-locked loop.

2. Description of the Related Art

Phase-locked loops (PLLs) are frequently used in communication systems to facilitate signal synchronization between a receiver and a transmitter. Specifically, a PLL can be used to synchronize a local oscillator in the receiver with a remote oscillator in the transmitter. This synchronization ensures that the local and remote oscillators have the same or a related frequency and, in some cases, phase.

FIG. 1A illustrates an exemplary phase-locked loop (PLL) 100. PLL 100 includes a phase detector 101, a charge pump 103, a filter 105, and a voltage-controlled oscillator (VCO) 106 (i.e. the local oscillator). Phase detector 101 detects the difference in frequency and phase between a reference signal R (which is extracted from, for example, a transmitted signal or a reference oscillator) and a feedback signal FB (which is an output of VCO 106). If there is a frequency/phase difference, then phase detector 101 generates output signals 102 whose amplitudes are related to that difference (called error signals).

In one embodiment, these error signals are "up" and "down" signals that charge pump 103 can use to source and sink current to and from filter 105 (e.g. a low-pass loop filter). For example, if the VCO frequency is too low, then phase detector 101 sets the "up" signal high, which triggers charge pump 103 to source current into filter 105, thereby increasing the voltage provided to VCO 106. On the other hand, if the VCO frequency is too high, then phase detector 101 sets the "down" signal high, which triggers charge pump 103 to sink current from filter 105, thereby reducing the voltage provided to VCO 106. The effect of the resulting control voltage $V_c$ at control voltage node 104 is to adjust VCO 106 to the same frequency and phase as signal R.

The adjustment made in VCO 106 can be significantly distorted by parasitic current, which can be generated by certain transistors. In general, transistors of current submicron CMOS technologies tend to be leaky in their off (i.e. non-conducting) state. That is, a small (but undesirable) parasitic current flows from the drain to the source of a transistor when its gate-to-source voltage is zero (which defines an off state).

Certain transistors in charge pump 103, specifically those serving as switches to source or sink current, can cause significant performance issues if leakage current is present. For example, these sourcing/sinking transistors are ideally turned on for a tiny fraction of a reference period and are turned off (thereby ideally contributing zero current) for the rest of the period. Because these sourcing/sinking transistors actually generate leakage currents in their off state, certain capacitors (shown in FIG. 3A and described below) of filter 105 can be partially charged or discharged within the reference period.

This partial discharge causes an ideal control voltage $V_{c(ideal)}$ to vary in a periodic manner, thereby resulting in an actual control voltage $V_{c(actual)}$ shown by the sawtooth waveform in FIG. 1B. This variation in the control voltage $V_c$ at control voltage node 104, in turn, can cause undesirable reference spurs in VCO 106. These reference spurs can detract from the desired signal purity expected of VCO 106.

Certain conditions, such as high temperature when the CMOS device threshold voltage is low, can increase transistor leakage in charge pump 103, thereby exacerbating the control voltage variation and associated spur generation. To minimize this variation in control voltage $V_c$, longer than minimum length transistors can be used for the sourcing/sinking transistors, thereby resulting in a higher threshold voltage for those transistors. Unfortunately, these larger transistors, although having less leakage, are slower than minimum length devices.

Therefore, a need arises for methods of and circuits for substantially reducing the parasitic current that leaks to the control voltage node of a PLL.

SUMMARY OF THE INVENTION

Parasitic current at the control voltage node of a phase-locked loop (PLL) can significantly reduce performance of the PLL. Off-state transistors in either the charge pump or the filter (both being components of the PLL) can cause this parasitic current. Methods of and circuits for mitigating this parasitic current are described.

In accordance with one aspect of the invention, a method of canceling a parasitic current generated by a charge pump in the PLL is described. In this method, a leakage current associated with leaky circuits in the charge pump can be determined. An opposing current can be injected to the control voltage node. This opposing current is equal, but opposite, to the leakage current, thereby advantageously canceling the effect of such leakage current.

Determining the leakage current associated with the leaky circuits can include providing a replica of the leaky circuits and sensing an associated leakage current of the replica. The opposing current is based on this associated leakage current.

To provide the above-described functions, a cancellation circuit can be used in the PLL. This cancellation circuit can include the replica leaky circuits, an amplifier including an output stage, and a replica output stage receiving the same control voltages as the output stage. In one embodiment, the negative input and output terminals of the amplifier can be connected to the replica leaky circuits, whereas the positive input terminal can be connected to the control voltage node of the PLL. The replica output stage can include an output node connected to the control voltage node of the PLL. The output stage and the replica output stage are driven by identical voltages. These identical voltages can be based on voltages provided to the negative and positive input terminals of the amplifier.

In this configuration, the amplifier can transfer a control node voltage to a replica voltage node of the PLL. Therefore, the replica node voltage (i.e. the output of the amplifier) and a control voltage on the control voltage node are equal.

In accordance with another aspect of the invention, a method of eliminating a parasitic current generated by a filter in the PLL is described. This filter can include a plurality of programmable capacitors. Each programmable capacitor can include a capacitor connected to a first voltage source as well as a first switch provided between the capacitor and the control voltage node. In this method, for each programmable capacitor in an unused state, the capacitor can be charged to the same potential as the control voltage node, thereby providing the same potential on both sides of the switch and eliminating any leakage current.

To provide this function, a circuit for eliminating a parasitic current can be used. This circuit can include a unity gain buffer circuit coupled in operative relation to the plurality of programmable capacitors in the filter. In one embodiment, the unity gain buffer circuit can include a unity gain buffer and, for each programmable capacitor, a second switch provided between the capacitor and the output terminal of the unity gain buffer. The unity gain buffer can be implemented using an operational amplifier (op-amp) in which its negative input terminal and output terminal of the op-amp are connected and, similarly, its positive input terminal and the control voltage node are connected.

A "used" capacitor would have its first switch (i.e. the associated switch connected to the control voltage node) closed and its second switch (i.e. the associated switch connected to the unity gain buffer) open. In contrast, an "unused" capacitor would have its first switch open and its second switch closed. In one embodiment, the first and second switches associated with a capacitor can be controlled by complementary signals, i.e. if one signal is a "closed" signal, then the other is an "open" signal.

DETAILED DESCRIPTION OF THE FIGURES

A parasitic current in a phase-locked loop (PLL) that leaks to the control voltage node of the PLL can be canceled or eliminated. A charge pump that leaks to a control voltage node of the PLL can generate this parasitic current. In one embodiment, cancellation circuitry can be used to cancel the parasitic current generated by leaky circuits of the charge pump. This cancellation circuitry can include a replica of the leaky circuits of the charge pump as well as sensing circuitry. The sensing circuitry can advantageously detect the leakage current of the replica leaky circuits and then inject equal, but opposite, current to the control voltage node. Because the cancellation circuitry and the leaky circuits are both connected to the control voltage node of the PLL, the opposing currents can cancel one another, thereby ensuring that the control voltage node is substantially unaffected by leakage current. In this manner, the cancellation circuitry can eliminate reference spurs, thereby advantageously improving performance of the PLL.

Figure 2A:
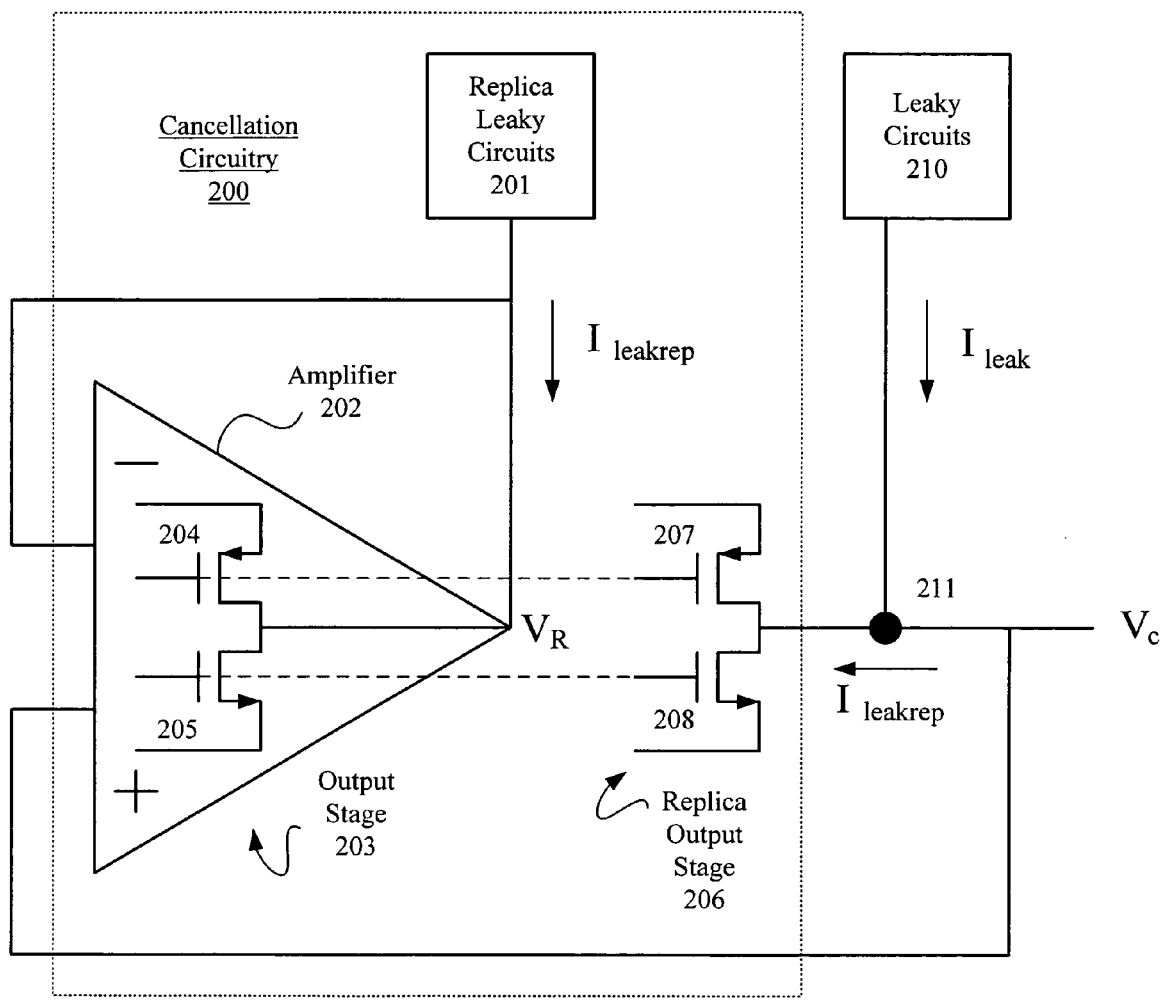
FIG. 2A illustrates one embodiment of circuitry for canceling the parasitic current generated by a charge pump.

FIG. 2A illustrates exemplary cancellation circuitry 200 for canceling the parasitic current $I_{leak}$ generated by leaky circuits 210 and provided to a control voltage node 211. In this embodiment, cancellation circuitry 200 can include replica leaky circuits 201, an amplifier 202, and a replica output stage 206. Note that amplifier 202 is in addition to any amplifier that may be included within charge pump 103. Therefore, cancellation circuitry 200 can be implemented separately from charge pump 103 in some embodiments and implemented integrally with charge pump 103 in other embodiments.

Figure 2B:
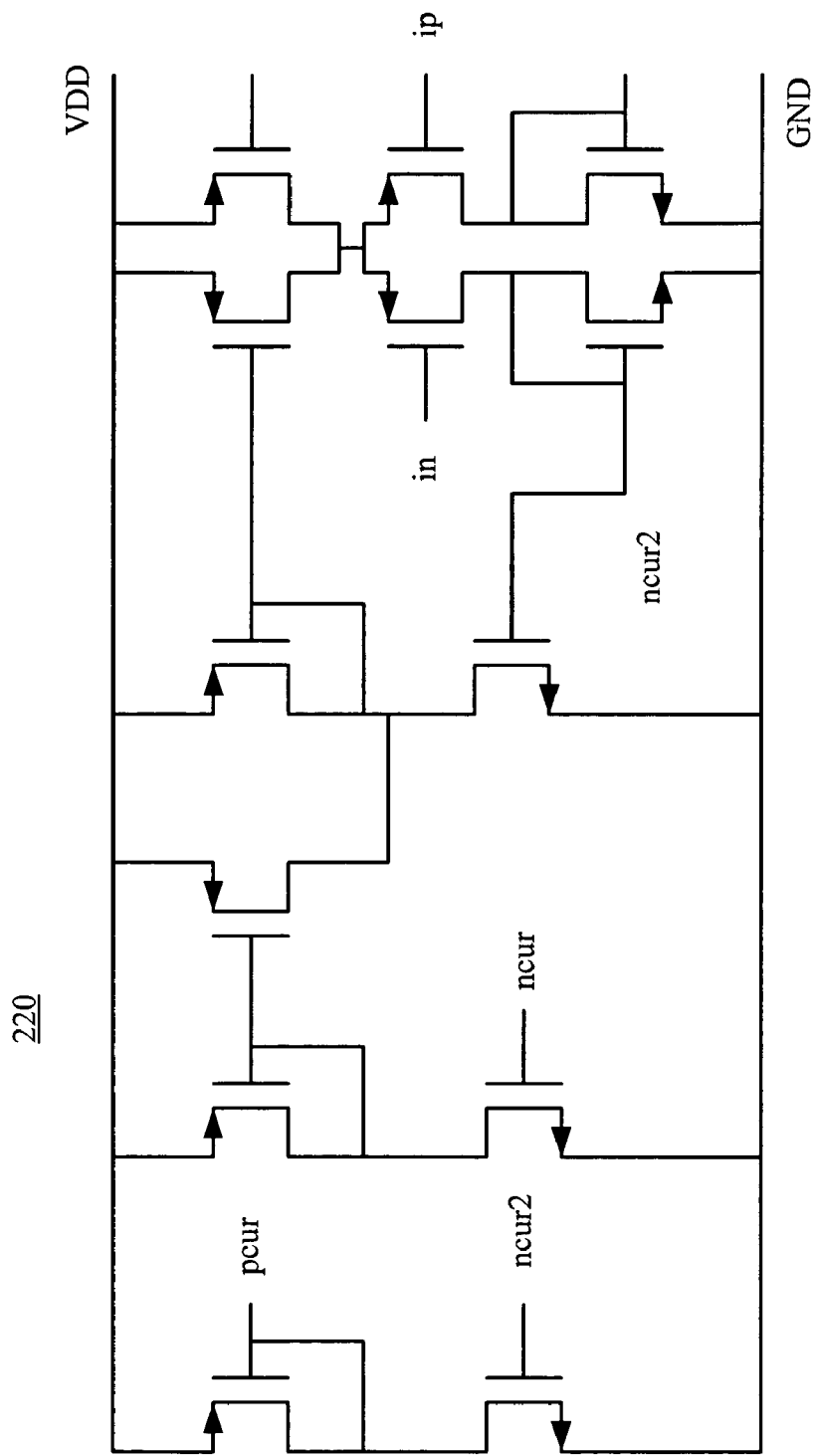
FIGS. 2B and 2C illustrate an exemplary self-biased amplifier.
Figure 2C:
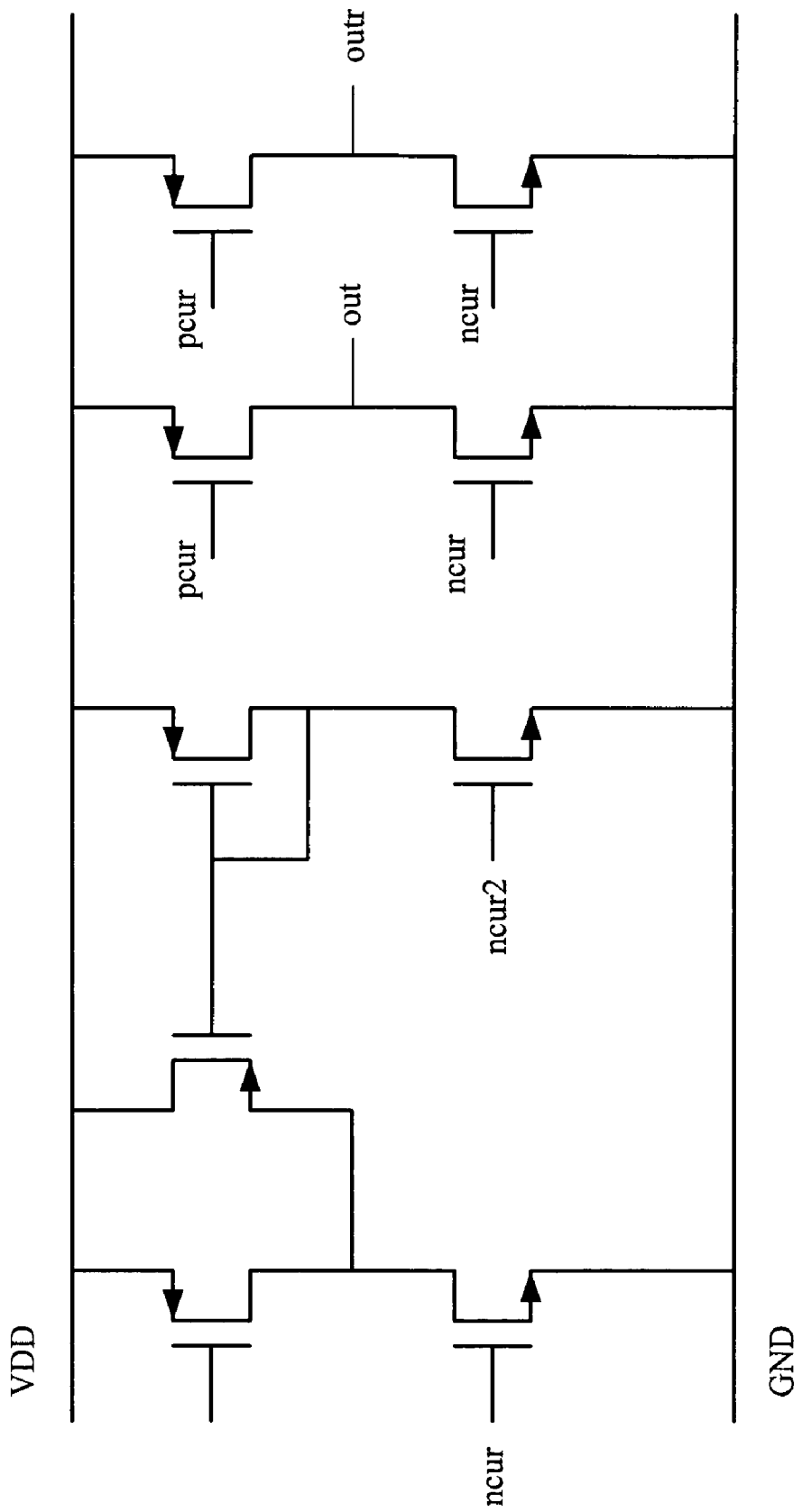

Amplifier 202 can receive the control voltage $V_c$ from leaky circuits 210 (via control voltage node 211) on its positive terminal and the replica node voltage $V_R$ from replica leaky circuits 201 on its negative terminal. Notably, replica leaky circuits 201 can be the same as those provided in leaky circuits 210. Moreover, the output terminal of amplifier 202, which generates replica node voltage $V_R$, is connected to its negative input terminal. In this configuration, amplifier 202 can force replica node voltage $V_R$ to be substantially equal to the control voltage $V_c$. Therefore, substantially equal parasitic currents are provided. That is, leakage current $I_{leak}$ can be substantially equal to replica leakage current $I_{leakrep}$. In one embodiment, amplifier 202 can be implemented with a self-biased amplifier in which the bias depends on leakage current $I_{leak}$. FIGS. 2B and 2C illustrate an exemplary self-biased amplifier 220 in which the bias depends on leakage current $I_{leak}$.

In accordance with one aspect of the invention and referring back to FIG. 2A, this replica leakage current $I_{leakrep}$ is transferred to control voltage node 211 using replica output state 206. Specifically, amplifier 202 includes an output stage 203 comprising a PMOS transistor 204 coupled in series with an NMOS transistor 205. Transistors 204 and 205 are typically connected to a higher voltage source (e.g. VCC) and a lower voltage source (e.g. VSS), respectively. The voltages provided on the negative and positive input terminals of amplifier 202 can control (but are not necessarily directly provided to) the gates of transistors 204 and 205.

Replica output stage 206 is substantially the same as output stage 203. That is, replica output stage 206 can comprise a PMOS transistor 207 coupled in series with an NMOS transistor 208. Transistors 207 and 208 can be connected to the same voltage sources as output stage 203. To transfer the replica leakage current $I_{leakrep}$, the voltages provided to the gates of transistors 204 and 205 can be provided to the gates of transistors 207 and 208, respectively, and the output of replica output stage 206 can be connected to control voltage node 211. Note that replica output stage 206 can be implemented integrally with amplifier 202, thereby forming a dual-output amplifier.

Because control voltage node 211 receives both the leakage current $I_{leak}$ and the replica leakage current $I_{leakrep}$ (which is equal but opposite to leakage current Ileak), the net current injected to control voltage $V_c$ is zero. Therefore, control voltage $V_c$ experiences minimal variation, which in turn significantly reduces the generation of reference spurs in the VCO.

Figure 1A:
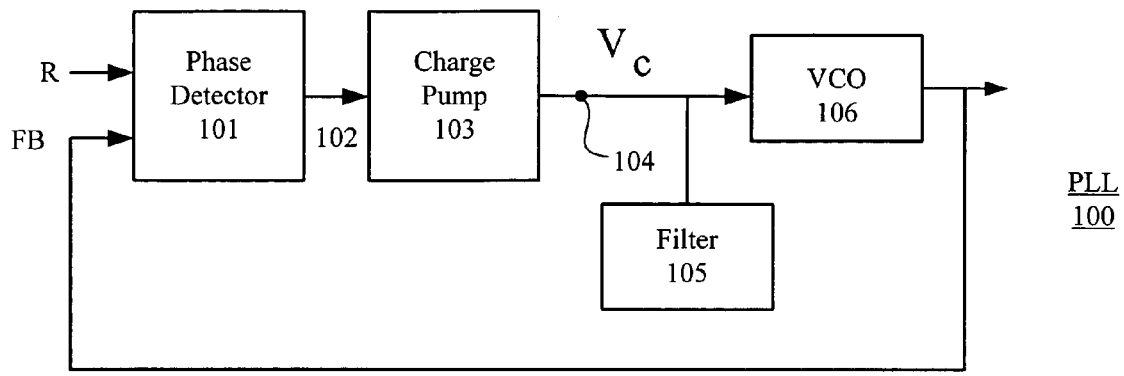
FIG. 1A illustrates an exemplary phase-locked loop (PLL) that generates a control voltage $V_c$ for controlling its voltage-controlled oscillator (VCO).
Figure 1B:
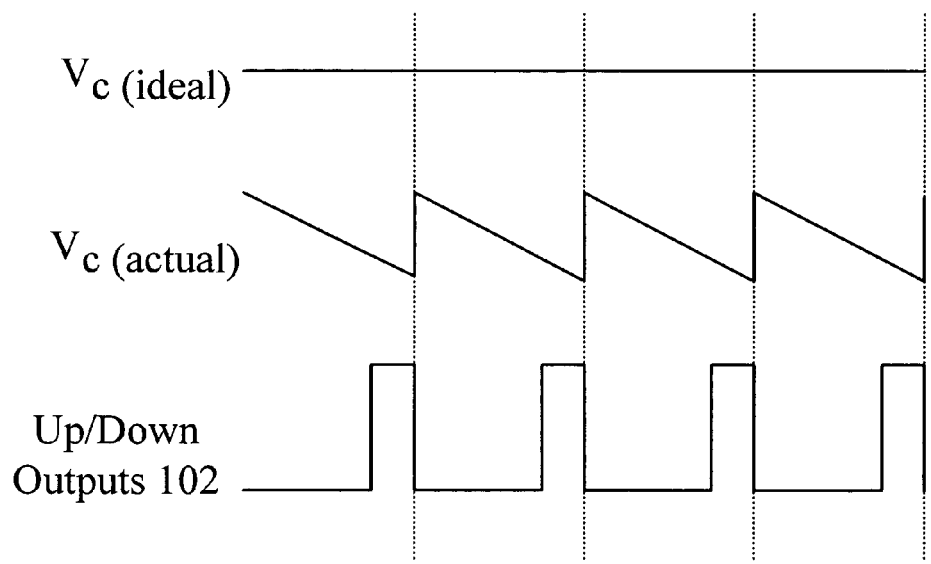
FIG. 1B illustrates how leaky transistors can result in a varying control voltage. This varying control voltage can significantly degrade the performance of the PLL.
Figure 3:
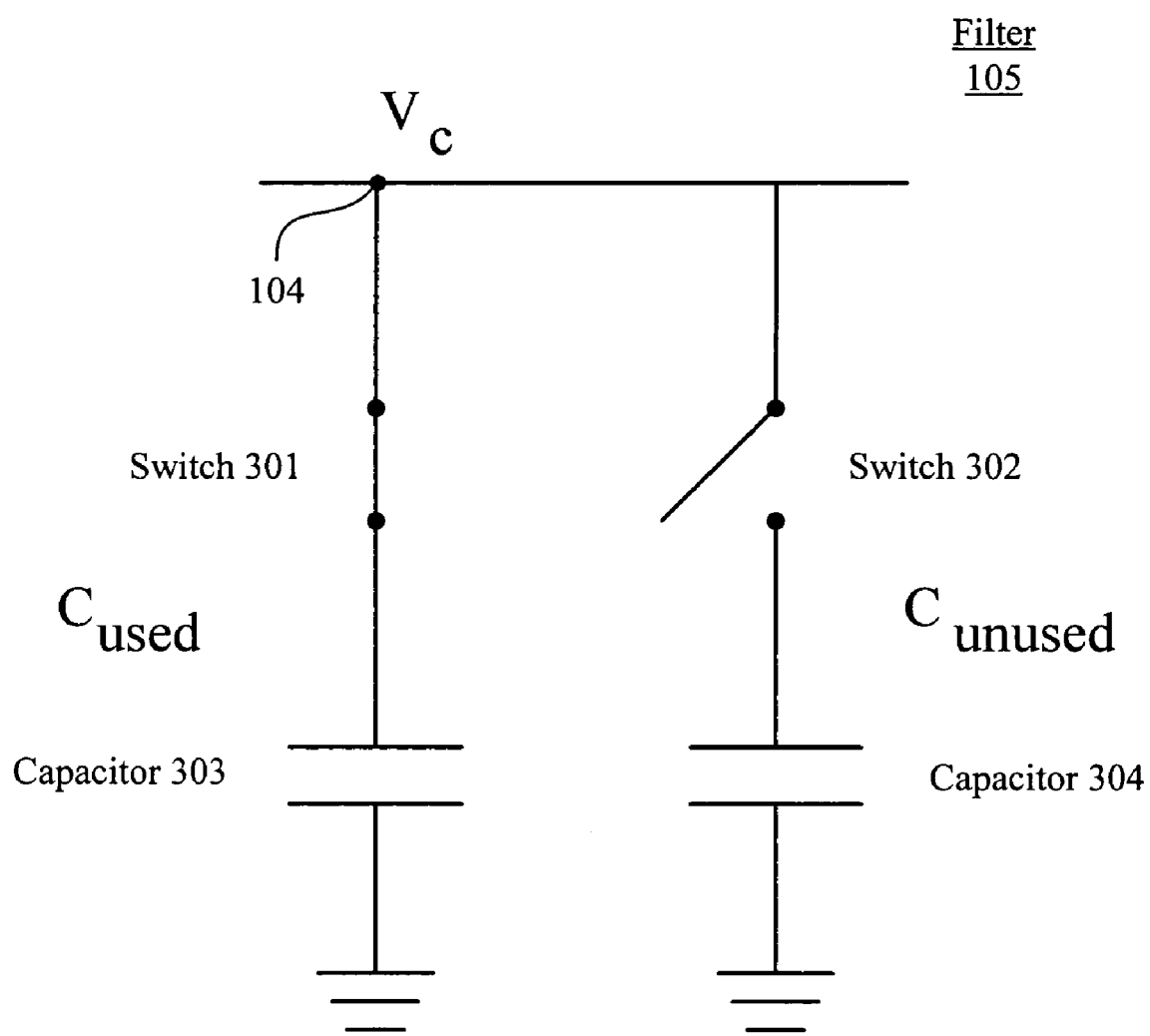
FIG. 3 illustrates an exemplary filter used in a PLL. This filter includes a plurality of programmable capacitors.

In accordance with another aspect of the invention, parasitic current generated by the filter that leaks to the control voltage node of the PLL can be eliminated. FIG. 3 illustrates a programmable capacitor that can be used in filter 105 (see FIG. 1) in a single chip embodiment of PLL 100. In filter 105, switch 301 and capacitor 303 are connected in series.

Similarly, switch 302 and capacitor 304 are connected in series between a control voltage 104 and a voltage source.

In FIG. 3, switch 301 is closed, thereby connecting control voltage node $V_c$ to a terminal of capacitor 303, and switch 302 is open, thereby disconnecting control voltage node $V_c$ from a terminal of capacitor 304. Therefore, a capacitance $C_{used}$ is connected to node control voltage node $V_c$, and a capacitance $C_{unused}$ is disconnected from to node control voltage node $V_c$. Unfortunately, because switches 301 and 302 are typically implemented using transistors, open switch 302 can generate parasitic current in the manner previously described. In this case, capacitance $C_{unused}$ may be charged through the leakage current to the same potential as control voltage node 104. However, because this leakage current is very small, switch 302 may "leak" for a long time, thereby potentially generating reference spurs at the output of the VCO.

Figure 4A:
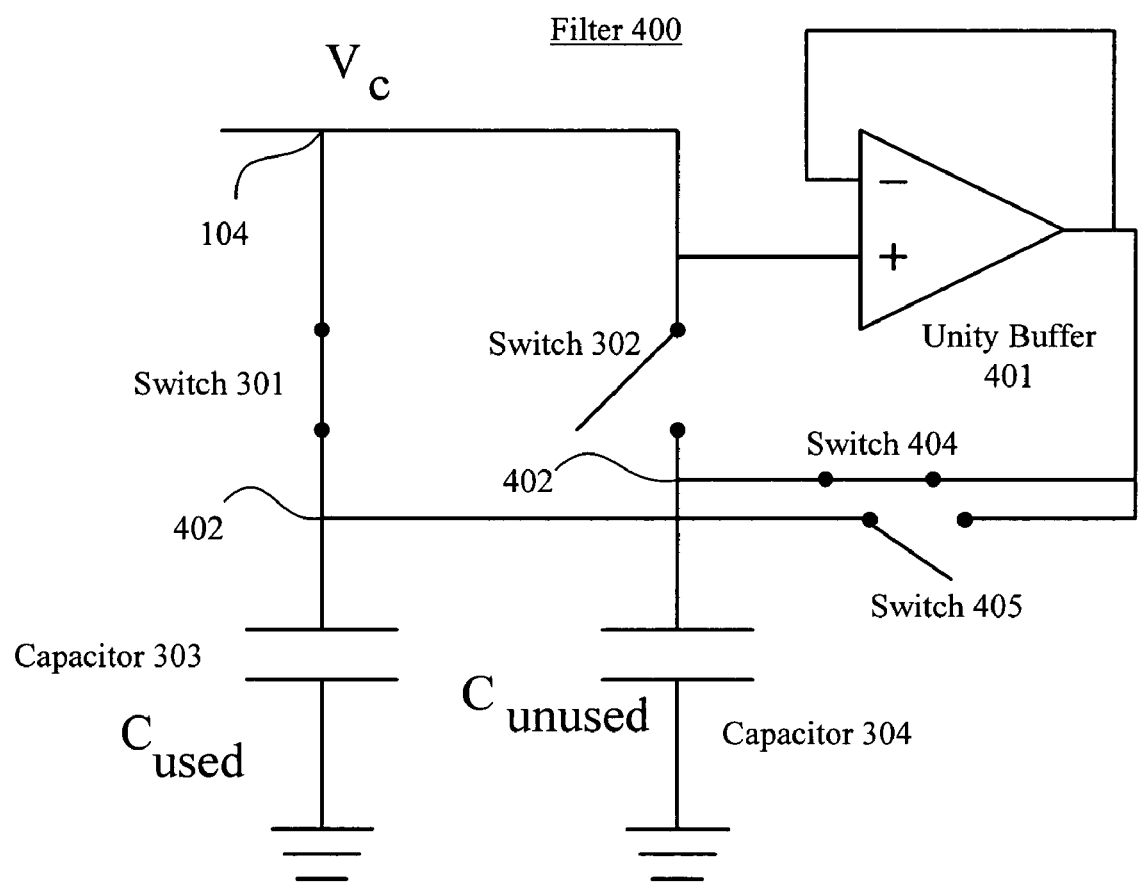
FIG. 4A illustrates using a unity gain buffer to eliminate the leakage current of the unused programmable capacitor of FIG. 3.

In one embodiment, a unity gain buffer can be used to eliminate the parasitic current generated by the filter. FIG. 4A illustrates one embodiment of a filter 400 that includes a unity gain buffer 401 coupled in operative relation to a plurality of programmable capacitors. To eliminate the parasitic current in filter 400, a negative input terminal of unity gain buffer 401 as well as its output terminal can be connectable to nodes 402, which are located between the switches (e.g. switches 301 and 302) and capacitors (e.g. capacitors 303 and 304) of the programmable capacitors. Switches, e.g. switches 404 and 405 in filter 400, can be used to provide this connection. A positive input terminal of unity gain buffer 401 can be connected to control voltage node 104.

A used capacitor would have its associated switch to the control voltage node closed and its associated switch to the unity gain buffer open (e.g. for capacitor 303, switch 301 can be closed and switch 405 can be opened). In contrast, an unused capacitor would have its associated switch to the control voltage node open and its associated switch to the unity gain buffer closed (e.g. for capacitor 304, switch 302 can be opened and switch 404 can be closed). (Note that the two switches associated with a capacitor can be controlled by complementary signals (i.e. if one is a "closed" signal, then the other is an "open" signal).) In this configuration, unity gain buffer 401 can charge the unused capacitor (i.e. capacitor 304 in FIG. 4A) to the same potential as control voltage node 104. Thus, both sides of switch 302 should be at the same potential, thereby eliminating any leakage current. Similarly, the potential across open switch 405 is substantially reduced to zero, thereby eliminating leakage current through open switch 405.

Figure 4B:
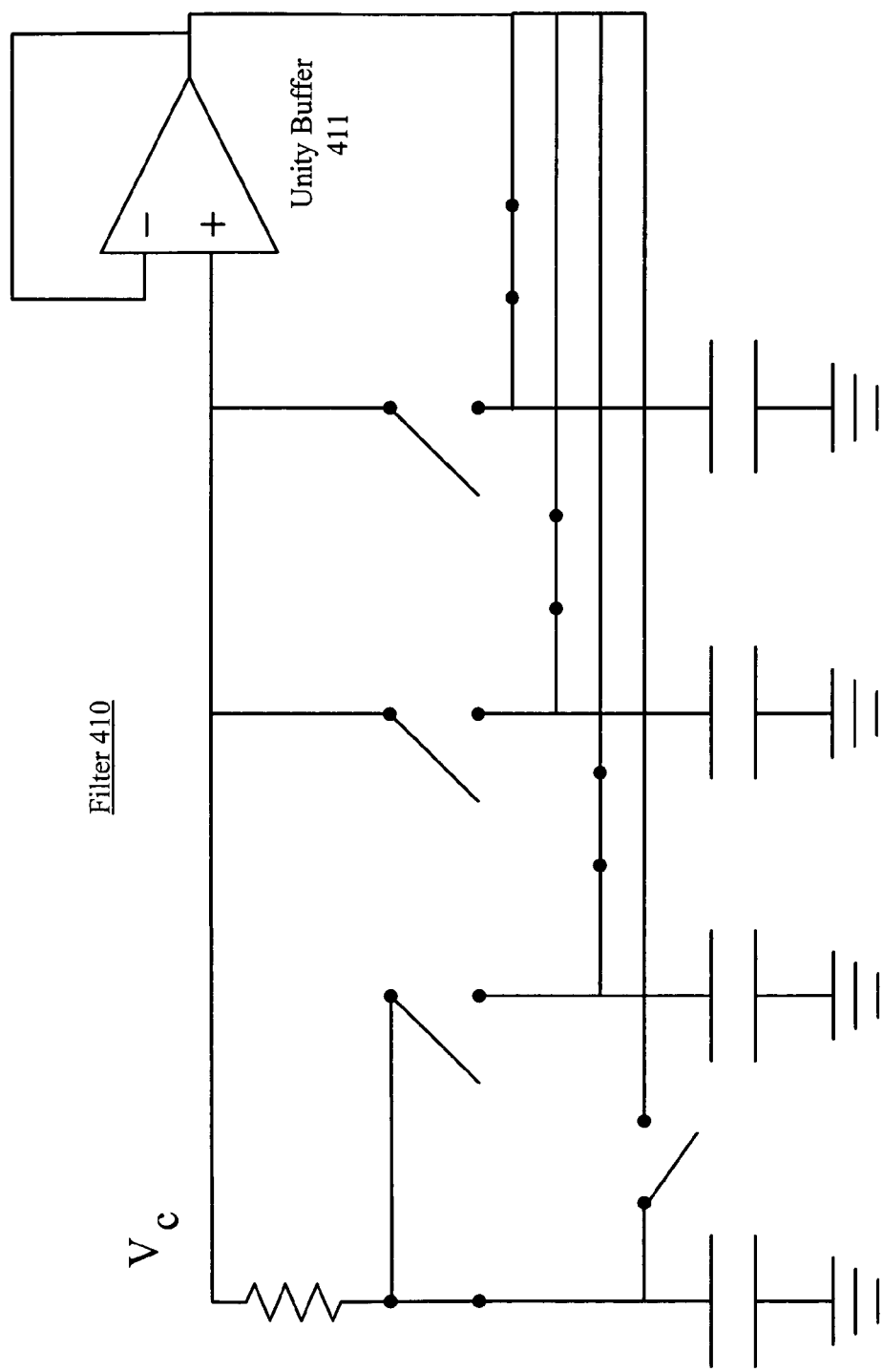
FIG. 4B illustrates using a single unity gain buffer to eliminate the leakage current of a plurality of unused programmable capacitors.

Note that a filter may have a plurality of unused programmable capacitors. FIG. 4B illustrates using a single unity gain buffer 411 to eliminate the leakage current of a plurality of unused programmable capacitors in a filter 410. In this case, the output terminal of unity gain buffer 411 can be connectable to the control voltage node and each of the programmable capacitors using the same configuration described in reference to FIG. 4A.

Note that a typical PLL loop filter comprises two parallel arms between a control voltage node and ground. The first arm comprises a capacitor, which may be a switchable, variable capacitor. The second arm comprises a series combination of a resistor and a capacitor, with the resistor being coupled to the control voltage node and the capacitor and the capacitor being coupled to ground. Again, the capacitor in the series-arranged arm may be a switchable, variable capacitor.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. Note that the terms "cancel", "eliminate", "same", "identical", and other similar terms are meant to signify desirable results. Therefore, actual results that slightly vary from these desirable results are still within the scope of the invention.

Accordingly, it is intended that the scope of the invention be defined by the following Claims and their equivalents.

The invention claimed is:

1. A method of canceling a parasitic current generated by a charge pump that leaks to a control voltage node of a phase-locked loop (PLL), the method comprising:
   determining a leakage current of leaky circuits in the charge pump, wherein determining includes:
      providing a replica of the leaky circuits; and
      sensing an associated leakage current of the replica using an amplifier; and
   injecting an opposing current to the control voltage node using a replica output stage, the replica output stage being based on an output stage of the amplifier,
   wherein the opposing current is equal, but opposite, to the leakage current.

2. A cancellation circuit for canceling a parasitic current, the parasitic current being generated by leaky circuits in a charge pump and provided to a control voltage node of a phase-locked loop (PLL), the cancellation circuit comprising:
   replica leaky circuits that are identical to the leaky circuits in the charge pump;
   an amplifier including an output stage, wherein a negative input terminal and an output terminal of the amplifier are connected to the replica leaky circuits, and wherein a positive input terminal is connected to the control voltage node of the PLL; and
   a replica output stage receiving the same control voltages as the output stage, wherein an output node of the replica output stage is connected to the control voltage node of the PLL.

3. The cancellation circuit of claim 2, wherein the amplifier transfers the control voltage to a replica voltage node of the PLL, wherein the replica node voltage and a control voltage on the control voltage node are equal.

4. The cancellation circuit of claim 3, wherein each of the output stage and the replica output stage includes:
   a PMOS transistor connected to a first voltage source; and
   an NMOS transistor connected to a second voltage and the PMOS transistor,
   wherein gates of the PMOS and NMOS transistors in the output stage and the replica output stage are controlled by identical voltages.

5. The cancellation circuit of claim 4, wherein the identical voltages are based on voltages provided to the negative and positive input terminals of the amplifier.

6. A method of eliminating a parasitic current generated by a filter that leaks to a control voltage node of a phase-locked loop (PLL), the filter including a plurality of programmable capacitors, each programmable capacitor including a capacitor connected to a first voltage source as well as a switch connected between the capacitor and the control voltage node, the method comprising:
   for each programmable capacitor in an unused state,
      charging the capacitor to the same potential as the control voltage node, thereby providing the same potential on both sides of the switch.

7. A circuit for eliminating a parasitic current, the parasitic current being generated by a filter and provided to a control voltage node of a phase-locked loop (PLL), the filter including a plurality of programmable capacitors, the circuit comprising:
   a unity gain buffer circuit coupled in operative relation to the plurality of programmable capacitors in the filter, wherein each programmable capacitor includes:
   a capacitor connected to a first voltage source; and
   a first switch provided between the capacitor and the control voltage node.

8. The circuit of claim 7, wherein the unity gain buffer circuit includes:
   a unity gain buffer including an output terminal, a negative input terminal, and a positive input terminal; and
   a second switch provided between each capacitor and the output terminal of the unity gain buffer,
   wherein the output terminal and a negative input terminal of the unity gain buffer are connected,
   wherein for an unused programmable capacitor, the first switch is open and the second switch is closed, and
   wherein for a used programmable capacitor, the first switch is closed and the second switch is open.

9. A method of manufacturing a phase-locked loop (PLL), the PLL including a charge pump, the method including:
   providing a cancellation circuit for canceling a parasitic current, the parasitic current being generated by leaky circuits in the charge pump and provided to a control voltage node of the PLL, the cancellation circuit comprising:
      replica leaky circuits that are identical to the leaky circuits in the charge pump;
      an amplifier including an output stage, wherein a negative input terminal and an output terminal of the amplifier are connected to the replica leaky circuits, and wherein a positive input terminal is connected to the control voltage node of the PLL; and
      a replica output stage receiving the same control voltages as the output stage, wherein an output node of the replica output stage is connected to the control voltage node of the PLL.

10. The method of claim 9, wherein the amplifier can transfer the control voltage to a replica voltage node of the PLL.

11. The method of claim 10, wherein each of the output stage and the replica output stage includes:
   a PMOS transistor connected to a first voltage source; and
   an NMOS transistor connected to a second voltage and the PMOS transistor,
   wherein gates of the PMOS and NMOS transistors in the output stage and the replica output stage can be controlled by identical voltages.

12. The method of claim 11, wherein the identical voltages can be based on voltages provided to the negative and positive input terminals of the amplifier.

13. A method of manufacturing a phase-locked loop (PLL), the PLL including a filter having a plurality of programmable capacitors connected to a control voltage node, the method including:
   providing a unity gain buffer coupled in operative relation to the plurality of programmable capacitors in the filter, wherein providing the unity gain buffer includes:
   connecting an output terminal and a negative input terminal of the unity gain buffer; and
   connecting a positive input terminal of the unity gain buffer and the control voltage node.

14. A method of manufacturing a phase-locked loop (PLL), the PLL including a filter having a plurality of programmable capacitors connected to a control voltage node, the method including:
   providing a unity gain buffer coupled in operative relation to the plurality of programmable capacitors in the filter, wherein for each programmable capacitor,
   providing a first switch between a capacitor of the programmable capacitor and the control voltage node; and
   providing a second switch between the capacitor and the output terminal of the unity gain buffer.

* * * * *